(12) United States Patent
Patti et al.

(10) Patent No.: US 7,911,032 B2
(45) Date of Patent: Mar. 22, 2011

(54) METHOD FOR GENERATING A SIGNAL REPRESENTATIVE OF THE CURRENT DELIVERED TO A LOAD BY A POWER DEVICE AND RELATIVE POWER DEVICE

(75) Inventors: Davide Patti, Catania (IT); Vincenzo Sciacca, Aci Catena (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 1113 days.

(21) Appl. No.: 11/619,660

(22) Filed: Jan. 4, 2007

(65) Prior Publication Data
US 2007/0194828 A1    Aug. 23, 2007

(30) Foreign Application Priority Data
Jan. 4, 2006   (IT) .............................. VA2006A0001

(51) Int. Cl.
*H01L 29/66* (2006.01)
(52) U.S. Cl. ........ 257/577; 257/578; 257/579; 438/328; 438/329; 438/330; 327/202

(58) Field of Classification Search ............... 257/467, 257/577, 578, 579; 327/202; 438/328, 329, 438/330
See application file for complete search history.

(56) References Cited

U.S. PATENT DOCUMENTS 5,939,768 A  *  8/1999  Palara ........................... 257/577
5,973,367 A  *  10/1999 Williams ...................... 257/365
* cited by examiner

*Primary Examiner* — Thinh T Nguyen
(74) *Attorney, Agent, or Firm* — Lisa K. Jorgenson; Allen, Dyer, Doppelt, Milbrath & Gilchrist, P.A.

(57) ABSTRACT

An integrated power transistor includes emitter or source regions, and a comb-like patterned metal electrode structure interconnecting the emitter or source regions and defining at least one connection pad. The comb-like patterned metal electrode structure includes a plurality of fingers. A current sensing resistor produces a voltage drop representative of a current delivered to a load by the integrated power transistor. The current sensing resistor includes a portion of a current carrying metal track having a known resistance value and extending between one of the fingers and a connectable point along the current carrying metal track.

6 Claims, 5 Drawing Sheets

METHOD FOR GENERATING A SIGNAL REPRESENTATIVE OF THE CURRENT DELIVERED TO A LOAD BY A POWER DEVICE AND RELATIVE POWER DEVICE

FIELD OF THE INVENTION

The present invention relates to power devices, and more particularly, to a small size output transistor that integrates a sensing resistance for generating a voltage representative of the current delivered to a load.

BACKGROUND OF THE INVENTION

MOSFET and IGBT output power devices are commonly integrated on the same silicon substrate with current sensors for producing a voltage signal representative of the current absorbed by the load driven by the power device that is to be provided to a control circuit. These sensors are essentially in the form of a sensing transistor that is a scaled replica of the power MOSFET or IGBT, and are biased with the same voltages.

Typically, the sensing transistor is a portion of the cellular array structure of a corresponding integrated power device. The current flowing in the sensing transistor is substantially proportional to the current flowing through the power device. By connecting in series with the sensing transistor one or more resistors, as depicted in FIG. 1, a generated voltage drop, detectable by a control circuit, is proportional to the current that the power device delivers to a load. This technique is preferably used since the alternative of connecting a sense resistor in series with the power device would generate an excessive voltage drop that may alter the bias conditions of the power transistor.

However, there is the drawback that the integrated sensing resistor connected in series to the scaled sensing transistor occupies a non-negligible silicon area. Moreover, its value needs to be determined with great precision to avoid unacceptable errors in the feedback regulation of the current flowing through the power transistor.

Typically, the sensing resistance is determined with trimming techniques. An array of identical highly precise resistors is integrated on the silicon substrate, and connected in parallel through fuses, as shown in the electrical scheme and in the layout view of FIGS. 2a and 2b. The desired value of the sensing resistance is defined by the user by burning certain fuses and leaving intact the others in order to adjust it to the sensitivity of the current measuring circuit. This technique implies a corresponding silicon area consumption because in general not all resistors are utilized in the electrical circuit. Some of them remain isolated after having burned the corresponding fuses.

Another drawback is that the sensing resistor modifies the biasing of the sensing transistor. To make an accurate sensing of the current absorbed by the load, the portion of the power transistor used as a sensing transistor and connected in series with the sensing resistor needs to have a voltage-current characteristic that is as similar as possible to that of the whole integrated power device, in any functioning condition. When such a condition is not satisfied, there may be errors in sensing the current, and as a consequence, an imprecise feedback control of the current flowing through the device may result. Usually, this operation may be critical and it is based on the user's experience. It is verified whether or not (and how much) the functioning of this sensing portion of the integrated power device structure is representative of the functioning of the whole device.

SUMMARY OF THE INVENTION

An object of the present invention is to provide a device and corresponding method for generating a signal representative of the current that a power transistor delivers to a load while reducing the amount of silicon area required.

Differently from known devices, the integrated structure does not comprise a plurality of sensing resistors interconnected by fuses for trimming purposes, thus silicon area occupation is reduced. Moreover, it advantageously exploits the fact that the source or emitter electrode is formed by a plurality of metal strips with a comb-like geometry, interleaved with similar comb-like metal strips that define the gate or base electrode.

According to another feature of the present invention, the bias conditions of the portion used as a sensing transistor is not affected as in the prior art arrangements because the integrated sensing resistor is a portion of a metal strip that forms a finger of the comb-shaped source or emitter electrode, that carries a current to a corresponding connection pad that may be connected to externally. This portion of the metal strip is electrically defined between the connection pad and a sensing node (or another dedicated pad) and has a resistance of a pre-established value.

At the end of the sensing metal strip opposite to the connection pad there may be a dedicated pad to which an external control circuit of the current delivered to a load by the power transistor is connected. Alternatively, the control circuit may be integrated on the same chip with the power device. In this case, a dedicated sensing pad is not required.

BRIEF DESCRIPTION OF THE DRAWINGS

The invention is described referring to the attached drawings, wherein.

DETAILED DESCRIPTION OF THE PREFERRED EMBODIMENTS

The invention will be described for the case in which the power transistor is an NPN IGBT with a source connected to ground, but the same observations hold for a MOSFET or an IGBT of a different type.

Figure 1:
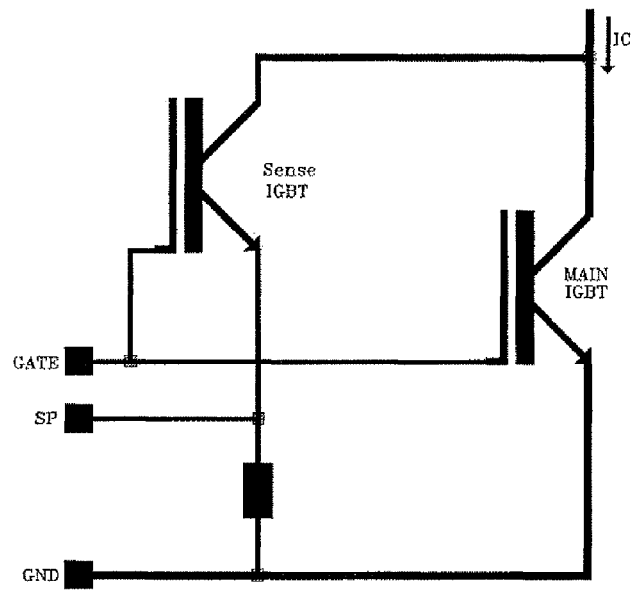
FIG. 1 depicts an electrical diagram of a power IGBT with an integrated current sensor according to the prior art.
Figure 3:
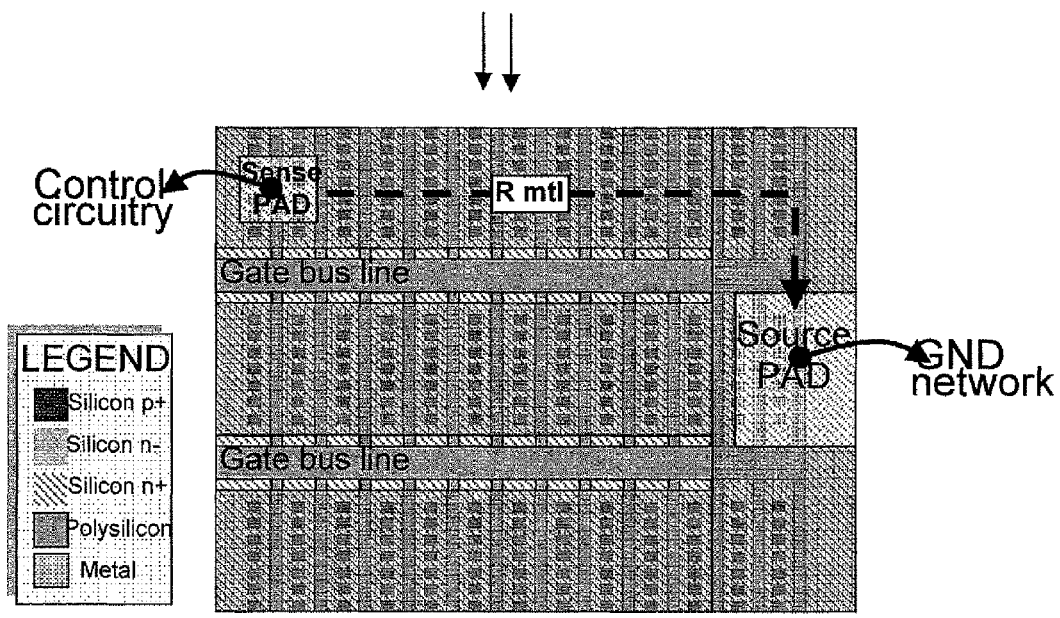
FIG. 3 schematically illustrates the layout according to a first embodiment of the power transistor having a sensing pad for connecting to an external control circuit according to the present invention.
Figure 2B:
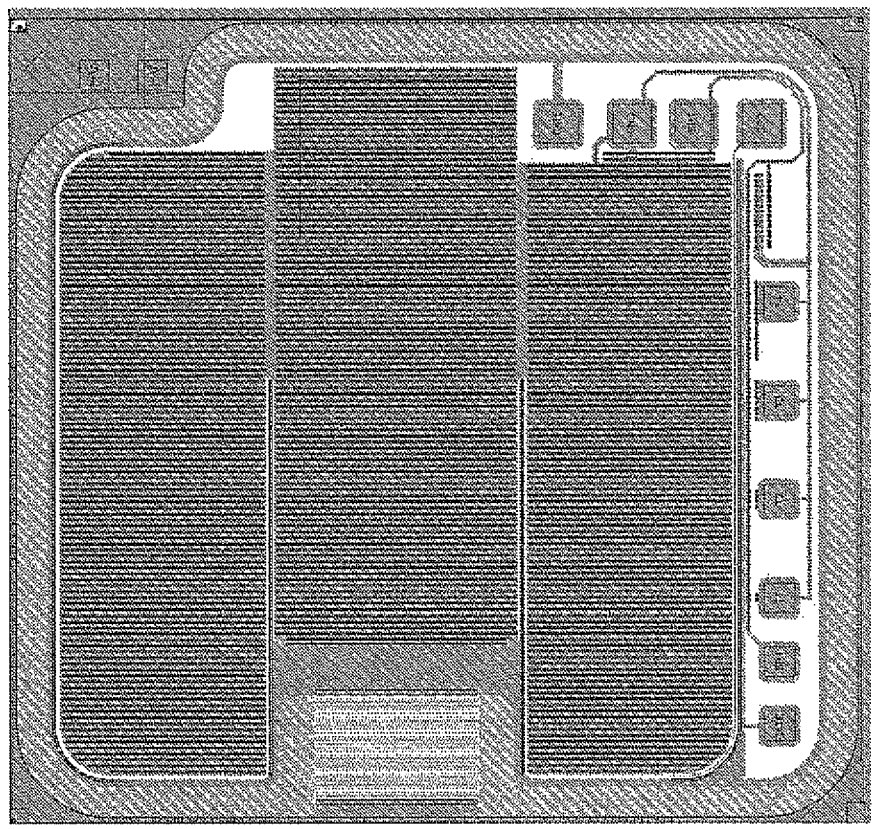
FIG. 2b depicts the layout of the electrical diagram of FIG. 2a according to the prior art.
Figure 2A:
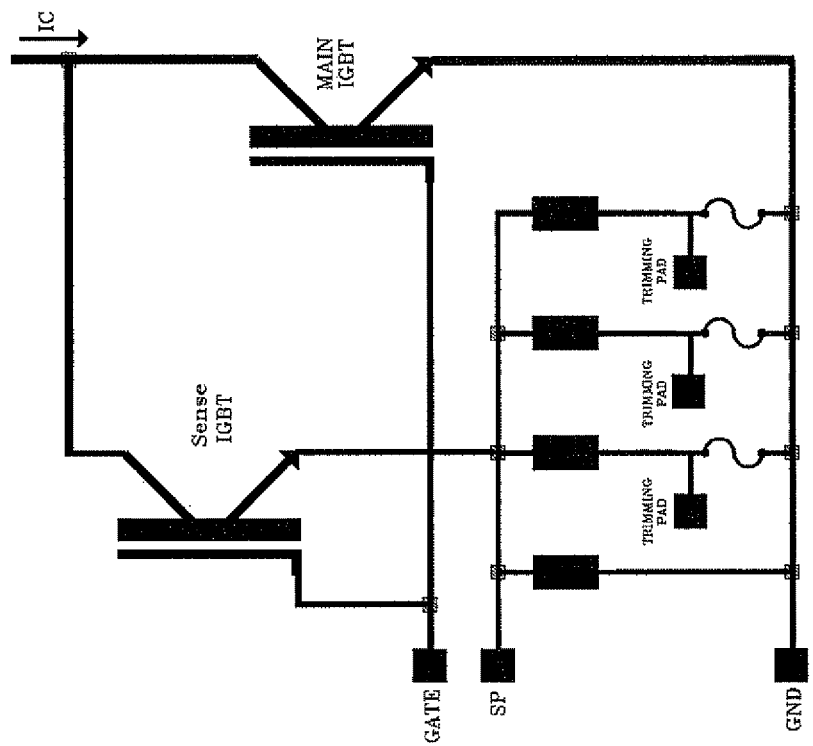
FIG. 2a depicts an electrical diagram, similar to that of FIG. 1, in which the value of an integrated sensing resistance can be trimmed according to the prior art.
Figure 6:
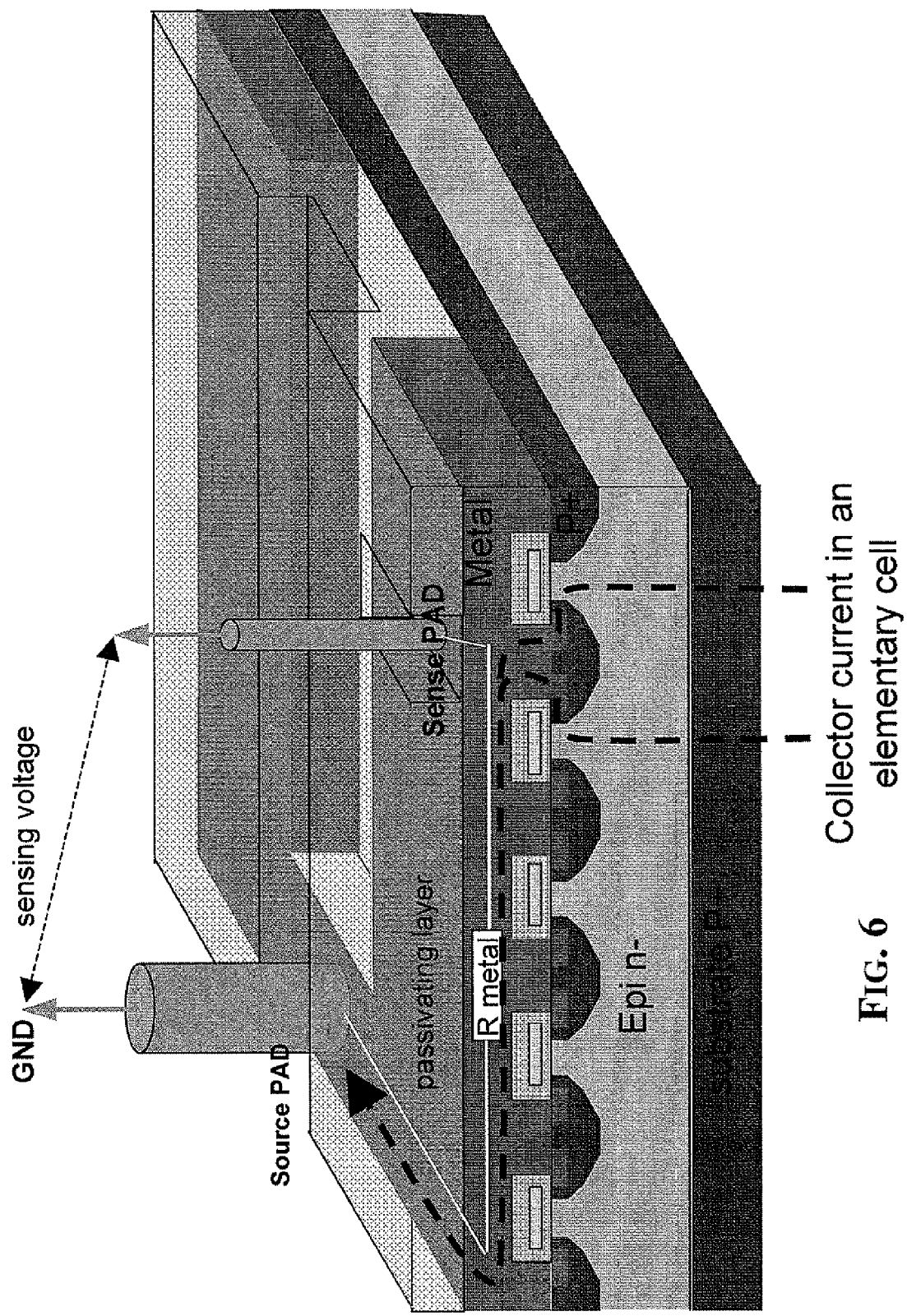
FIG. 6 is a partial three-dimensional sectional view of the integrated structure of the power transistor shown in FIG. 3.

According to a first embodiment, the power device has a layout as depicted in FIG. 3, and an integrated structure as illustrated in the partial three-dimensional sectional representation of FIG. 6. For the example shown, all the source regions are shorted together and connected to a pad SOURCE_PAD for connection to an external circuit through a metal strip current distributing electrode that geometrically alternates with polysilicon strips that compose or define the gate electrode. The broken lines and the arrows illustrate the path of the current flowing through the output power transistor.

A current sensing pad SENSE_PAD is realized on a metal strip finger of the source metal electrode. All the strip fingers of the comb-shaped source metal electrode are patterned from a homogeneous deposited metal layer, and have the same dimensions such that a portion of the current carrying metal path, identified in FIG. 3 with a broken line, that is between the sensing pad SENSE_PAD and the connection pad SOURCE_PAD, has a pre-established design resistance $R_{MTL}$. This resistance may be designed with high precision by defining shape and dimensions of the patterned metal, and by setting the specific resistivity of the deposited metal alloy layer.

The currents that the distinct fingers convey to the connection pad SOURCE_PAD are substantially equal to each other. As a consequence, the voltage drop on the contributory portion of the source current path with resistance $R_{MTL}$, that is, the voltage drop on the pads SENSE_PAD and SOURCE_PAD, will be proportional to the whole current delivered to an external load under any functioning condition.

With this arrangement it is no longer necessary to dedicate relatively large silicon areas for integrating trimmable sensing resistors because the resistance of the contributory portion of the current flowing in the monitored flow path of the metal electrode structure is such that a measurable voltage drop is present between the two pads. Moreover, the bias condition of the transistor is not modified because the sensing resistance is a portion of the transistor itself and not distinct from it.

It is possible to determine with enhanced precision the voltage drop between the pads SENSE_PAD and SOURCE_PAD by proper design choices. Experimentally it has been found that if the deposited metal layer is an aluminum-silicon alloy, and by scaling the width of each metal finger of the electrode structure down to a value of 100 µm-150 µm, the voltage drop between two pads SOURCE_PAD and SENSE_PAD, as indicated in the sample representation of FIG. 6, may have a value between 70 mV and 140 mV. This may be easily sensed with adequate precision by simple circuits not requiring complex layouts for integrating them.

The width of the finger will be defined taking into account the resistivity of the metal path, the length of the metal finger and of the perimeter of the active channel of the integrated power transistor structure. Preferably, the metal fingers of the source metal electrode are of metal alloys belonging to the group comprising at least one of AlSi, AlSiCu, Cu and W/AlSi.

Figure 4:
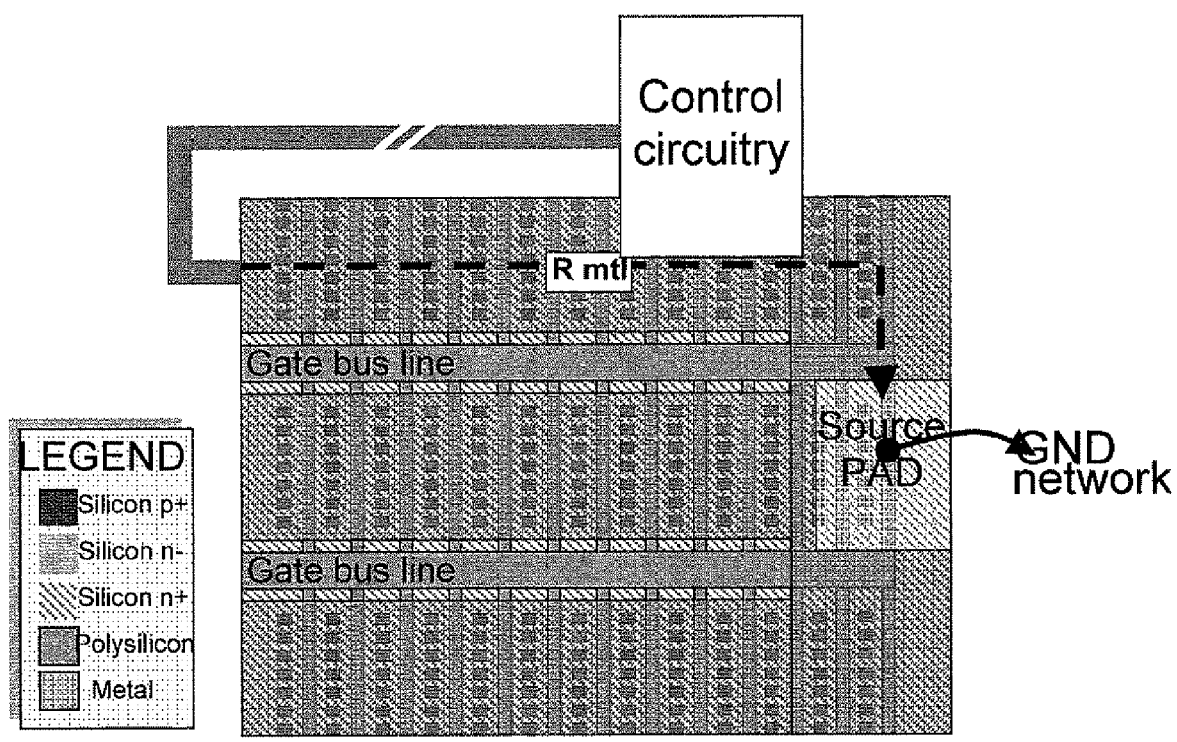
FIG. 4 shows the layout according to a second embodiment of the power transistor having a control circuit monolithically integrated in the same chip with the power transistor according to the present invention.

FIG. 4 depicts a second embodiment in which the sensing pad SENSE_PAD is not realized because it is unnecessary, given that the control circuit of the current absorbed by the power transistor is integrated on the same chip with the power transistor itself and the control current connects to an end portion of the metal current carrying path along a finger of the metal source electrode.

Figure 5:
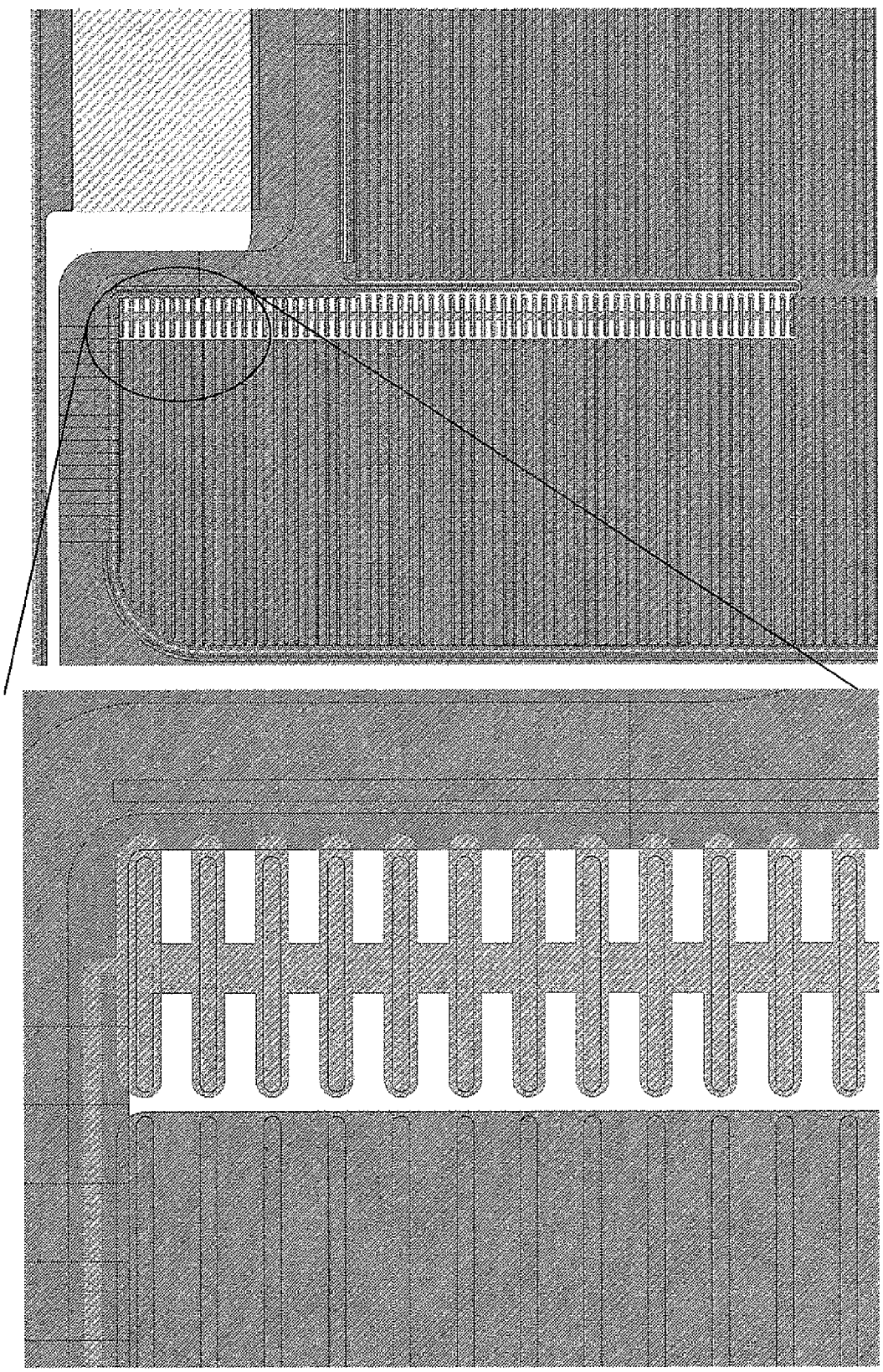
FIG. 5 shows details of the layout of a power device wherein metal strips of comb-like metal current distribution electrodes connect fingers of the integrated structure of the power transistor to a connection pad according to the present invention.

FIG. 5 is a layout of a power transistor, the various fingers of the source electrode of which are narrower than those depicted in FIGS. 3 and 4, such as to obtain on any of them a voltage drop that may be determined with enhanced precision. A non-limiting example of a sequence of process steps for realizing the device depicted in FIG. 6 is disclosed below.

On a semiconductor silicon substrate a field effect transistor with vertical current conduction IGBT PNP is realized using known photolithographic implantations and diffusions. The source or emitter metal electrode fingers form a comb-like structure.

The invention claimed is:

1. A device comprising:
an integrated power transistor comprising a plurality of emitter or source regions, and a comb-like patterned metal electrode structure interconnecting said plurality of emitter or source regions and defining at least one connection pad, said comb-like patterned metal electrode structure comprising a plurality of fingers; and
a current sensing resistor for producing a voltage drop representative of a current delivered to a load by said integrated power transistor, said current sensing resistor comprising a portion of a current carrying metal track having a known resistance value and extending between one of said plurality of fingers and a connectable point along said current carrying metal track, with at least one finger positioned therebetween.

2. The device of claim 1, wherein said current carrying metal track has a resistance equal to a ratio between a minimum detectable voltage and a nominal current absorbed by said plurality of emitter or source regions.

3. An integrated circuit comprising:
a semiconductor substrate;
an integrated power transistor on said semiconductor substrate, and comprising a plurality of emitter or source regions, and a comb-like patterned metal electrode structure interconnecting said plurality of emitter or source regions and defining at least one connection pad, said comb-like patterned metal electrode structure comprising a plurality of fingers; and
a current sensing resistor for producing a voltage drop representative of a current delivered to a load by said integrated power transistor, said current sensing resistor comprising a portion of a current carrying metal track having a known resistance value and extending between one of said plurality of fingers and a connectable point along said current carrying metal track, with at least one finger positioned therebetween.

4. The integrated circuit of claim 3, wherein said current carrying metal track has a resistance equal to a ratio between a minimum detectable voltage and a nominal current absorbed by said plurality of emitter or source regions.

5. A method for making an integrated circuit comprising:
forming a power transistor on a semiconductor substrate, the power transistor comprising a plurality of emitter or source regions, and a comb-like patterned metal electrode structure interconnecting the plurality of emitter or source regions and defining at least one connection pad, the comb-like patterned metal electrode structure comprising a plurality of fingers; and
forming a current sensing resistor for producing a voltage drop representative of a current delivered to a load by the integrated power transistor, the current sensing resistor comprising a portion of a current carrying metal track having a known resistance value and extending between one of the plurality of fingers and a connectable point along the current carrying metal track, with at least one finger positioned therebetween.

6. The method of claim 5, wherein the current carrying metal track has a resistance equal to a ratio between a minimum detectable voltage and a nominal current absorbed by the plurality of emitter or source regions.

* * * * *